United States Patent [19]

Maxwell et al.

[11] 4,060,797
[45] Nov. 29, 1977

[54] SERIAL DIGITAL BIT STREAM CODE DETECTOR

[75] Inventors: Anthony Robert Maxwell, East Ringwood; John Charles Platts, Doncaster, both of Australia

[73] Assignee: L. M. Ericsson Pty. Ltd., Australia

[21] Appl. No.: 587,210

[22] Filed: June 16, 1975

Related U.S. Application Data

[63] Continuation of Ser. No. 415,425, Nov. 13, 1973, abandoned.

[30] Foreign Application Priority Data

Nov. 13, 1972 Australia .............................. 1198/72

[51] Int. Cl.$^2$ ........................................... H03K 13/256
[52] U.S. Cl. ........................ 340/347 DD; 179/15 BS; 325/419; 328/75
[58] Field of Search ................... 178/69.5 R, 5.45 SY; 179/18 DA, 15 BS, 15 BY, 15 BV, 15 BA; 328/72, 75; 325/419; 340/172.5, 174 SD

[56] References Cited

U.S. PATENT DOCUMENTS

| | | | |
|---|---|---|---|
| 3,790,821 | 2/1974 | Adamson | 307/273 X |
| 3,818,143 | 6/1974 | Vrba et al. | 179/15 BA X |
| 3,851,109 | 11/1974 | Downs et al. | 179/18 DA |
| 3,873,781 | 3/1975 | Nissim | 179/18 DA UX |

OTHER PUBLICATIONS

Susskind, "Notes on Analog–Digital Conversion Technique," The Technology Press, MIT, 1957, pp. 27-29.
Susskind, Notes on Analog–Digital Conversion Techniques, Technology Press, MIT, 1957, pp. 4-27 to 4-29 & 4-32.
Analog Devices, Inc., Analog-Digital Conversion Handbook, 6/72, pp. 1-8.

Primary Examiner—Thomas J. Sloyan
Attorney, Agent, or Firm—Cushman, Darby & Cushman

[57] ABSTRACT

A code detector for detecting the presence or absence of particular binary digital signalling codes in the digital bit stream from extension telephones of a digital PABX telephone system. The detector is connected to a telephone being monitored and receives digital data from the telephone, which data may be random speech data or a signalling code. The detector consists essentially of a ROM which uses each of the data bits arriving in serial form as the least significant bits of the address for a micro-program stored in the ROM which provides the other address bits, thus causing the program to be stepped through a sequence of addresses which depend upon the sequence of the incoming data bits. For a program to end up at a specified address the ROM must receive the code which is unique in causing the program to arrive at that address. The detector then outputs a code representative of the detected code.

8 Claims, 1 Drawing Figure

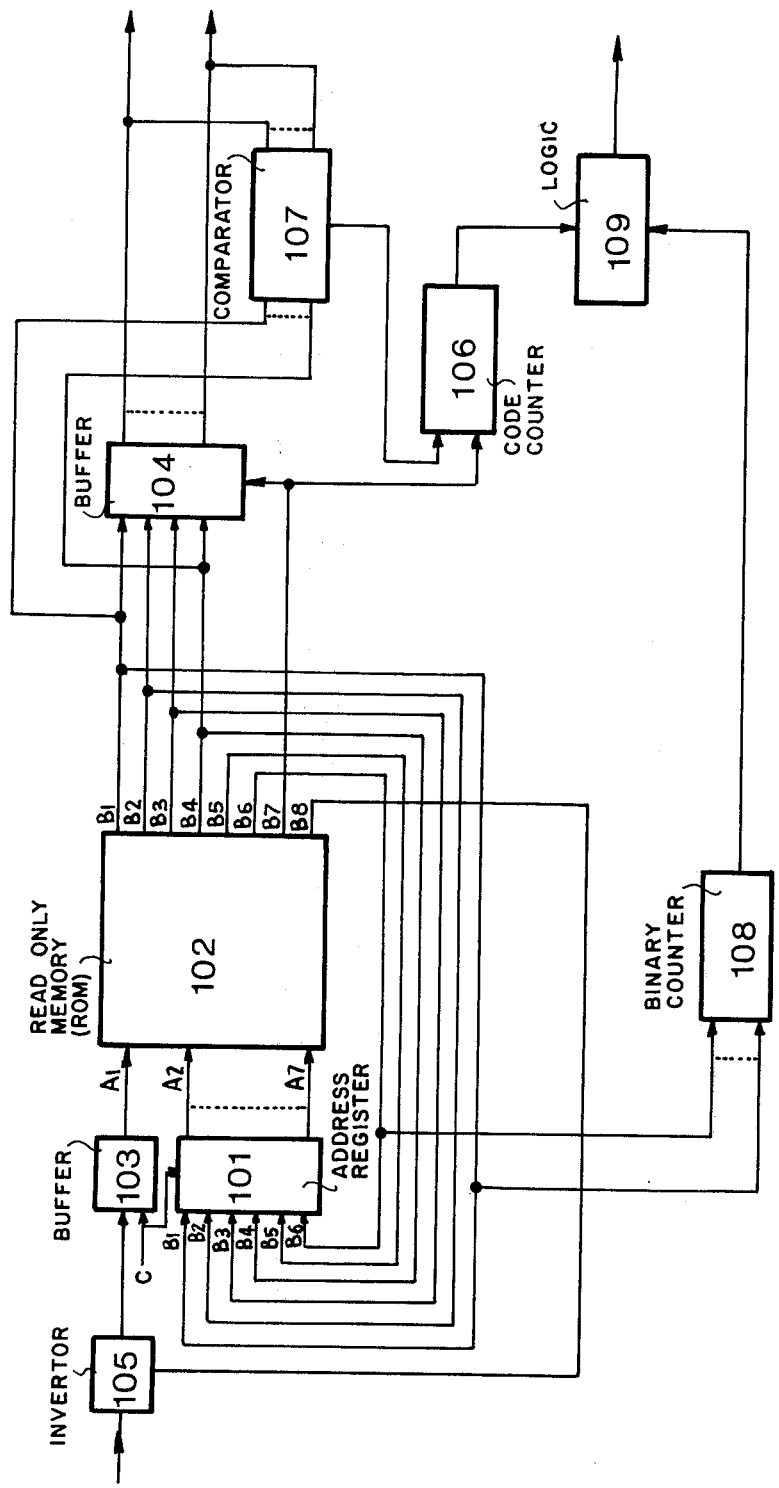

SERIAL DIGITAL BIT STREAM CODE DETECTOR

This is a continuation of application Ser. No. 415,425 filed Nov. 13, 1973, now abandoned.

This invention relates to a code detector and more particularly to a code detector for detecting the presence or absence of a particular sequence of bits in a digital bit stream.

One known device for the above purpose utilizes a shift register and associated decoding hardware but such a device suffers the disadvantage of requiring relatively complex hardware, particularly when the predetermined number of bits is large.

It is therefore an object of this invention to provide an improved code detector which does not suffer the disadvantage of the above known device.

According to the invention there is provided a code detector for detecting the presence or absence of particular sequences of data bits in a digital bit stream, including a memory adapted to sequentially receive said data bits, each location of said memory being programmed to contain one part of the address of two or more further locations in the memory, the other part of the address being provided by a bit or bits in said digital bit stream to cause said memory to address successive locations dependent upon the data bits received and said memory being adapted to provide an output when predetermined locations are reached, said output signifying the presence of a particular sequence.

The invention has particular utility in a digital telephone system wherein various digital codes from the telephones of the system must be detected and also, must be distinguished from random bits of digitized speech. A PABX telephone system suitable for utilizing this invention is described in our co-pending patent application entitled "Time Division Multiplexed Digital Switching Apparatus" and filed concurrently with the present application.

A particular embodiment of the invention will now be described in detail with reference to the accompanying drawing which shows a block diagram of the detector. This embodiment relates to a detector for receiving and detecting binary digital codes in a PABX telephone system as described in our abovementioned patent application.

The detector consists essentially of a read only memory (ROM) 102 programmed to detect serial comma free codes which enter the ROM 102 via a buffer 103 and inverter 105. The ROM 102 is a 128 word × 8 bit ROM which accepts the incoming data sequentially and decodes each bit as it arrives. Each data bit arriving at input $A_1$ of the ROM is used as the least significant ROM address bit. Thus the data bit selects one of two adjacent locations.

The selected location contains the address of the next pair of locations, one of which is selected by the next data bit.

Reference 101 is a 7 bit parallel in parallel out register called an address register which contains address bits $A_2 - A_7$ for the ROM. Input serial data is clocked into the buffer 103, one bit at a time to provide the additional address bit $A_1$ for the ROM. The address register 101 starts at address zero and assumes that the incoming data is a code. If the data bit corresponds to the required bit in the code, then the ROM 102 steps to the next location in the sequence and continues doing this until it has received all the bits of the code. If a data bit is received which does not correspond to a code, the addressed location of ROM 102 contains the six most significant bits of the start address and the ROM 102 returns to the start and tries again. To allow for the detection of more than one code various pairs of locations defined by outputs B1 - B6 of the ROM 102 contain two further addresses, neither of which is the start address. Thus in this embodiment the first nine bits of each code are identical with the first nine bits of any other code. On the tenth bit, however, one of the codes differs from the others and the ROM sequence follows one of the two paths from this point. In this embodiment there are fifteen such branch locations hence sixteen different code sequences. The ROM 102 will eventually synchronise with an existing incoming code which will thus be detected. When the ROM 102 has detected a complete code it outputs a flag on $B_7$ and the detected digit, dialled by an extension of the PABX system, on outputs $B_1 - B_4$.

Output $B_7$ from ROM 102 causes $B_1 - B_4$ to be clocked into an output buffer 104 and the start address to be returned to $A_2 - A_7$.

All the codes to be detected in this embodiment are 15 bits long and comprise 3 ones and 12 zeros. The number of consecutive ones is not more than two. If the code detector device of the embodiment receives a one when it is at the start address, instead of restarting, it steps to a further location. If it receives two more consecutive ones, the data in the addressed location will contain the address which the ROM 102 would have reached had it received three zeros after reaching the start address. The data in said addressed location will output a zero on B8. This applies one clock pulse to a toggle flip flop in the invertor 105 which causes all incoming data to be inverted. This allows the device to detect inverted data.

To increase the security against random data being detected as a code three repetitions of the code must be detected by a code counter 106. The code counter 106 is clocked when $B_7$ is a one and the input and output of the output buffer 104 are equal. The input and output of the output buffer 104 are connected to a 4 bit comparator 107 which increments the code counter 106 when the input and output of the output buffer 104 are equal. The input and output of the output buffer 104 are equal after the first two codes occurrences have been detected and remain equal for every consecutive code detected thereafter. The comparator 107 ensures that the counter 106 is clocked only when consecutive codes are the same. The code counter gives a flag output when it has counted n reptitions of the code.

A counter 108 is connected to count the number of times the start address is generated. The counter 108 is clocked whenever $B_1 - B_6$ are all zero and $B_7$ is zero, i.e., when the ROM 102 returns to the start address before reaching the end of its program. Data transmitted over lines to the code receiver device of the invention may contain errors and the device takes account of this fact by using a logic block 109 which gives an output after n correct codes have been received with less than m resarts.

It can then be assummed that when the device has received sufficient data bits to recognise the presence or absence of a code is present, the data in 104 may be read.

In a further embodiment where the device is time shared over a number of lines from a multiplexer (not shown) the code detected is stored in a memory (not shown) and if the code detected on a subsequent scan is the same, the action of the block 109 is modified so that only one detection of the code is necessary. It will be appreciated that this speeds up the operation and allows the device to be time shared over many more inputs than would otherwise be possible.

It should be appreciated that the invention is not limited to applications in telephone systems and of course could be used for any applications wherein the presence or absence of any sequence of digital data bits are to be detected. Also, whilst the invention has been described in relation to the detection of binary codes it is conceivable that it could be adapted to detect ternary or other codes. Furthermore by altering the size of the memory and the program of the memory the invention maybe adapted to detect codes other than 15 bit codes and other than codes having 12 zeros and 3 ones.

We claim:

1. A code detector for detecting the presence or absence of particular sequences of data serial bits in a digital bit stream, comprising a memory adapted to sequentially receive said data bits, each location of said memory being programmed to contain one part of the address of two or more further locations in the memory, the other part of the address being provided by a bit in said serial digital bit stream to cause said memory to address successive locations dependent upon the data bit received, said memory being adapted to provide a first output signal representative of said one part of the address of two or more further locations, and a second output signal indicating when predetermined locations are reached, said output signifying the presence of a particular sequence, said first output signal being fed back to the input of said memory via an address register and being combined with the other part of the address which is fed to the input of said memory via a buffer store, said code detector further comprising clock means for timing the addressing of said successive address locations.

2. The code detector as defined in the claim 1 wherein said data is binary digital data.

3. A code detector for detecting the presence or absence of particular sequences of data serial bits in a binary digital bit stream, comprising a memory adapted to sequentially receive said data bits, each location of said memory being programmed to contain one part of the address of two or more further locations in the memory, the other part of the address being provided by a bit in said serial binary digital bit stream to cause said memory to address successive locations dependent upon the data bit received, and said memory being adapted to provide a first output signal representative of the particular sequence detected when predetermined locations are reached, and a second output signal signifying the presence of a particular sequence, said memory first output signal being fed from the output of said memory back to the input of said memory via an address register and being combined with the other part of the address which is fed to the input of said memory via a buffer store, said code detector further comprising clock means for timing the addressing of said successive address locations.

4. A code detector as defined in claim 3 wherein the memory is a ROM in which a single data bit is used as the other part of the address and forms one bit of the address to select one of two possible locations.

5. A code detector as defined in claim 4 wherein a comparator is adapted to compare consecutive codes detected and increment a counter when consecutive codes are the same, said counter giving an output when it has counted a predetermined number ($n$) of repetitions of the code.

6. A code detector as defined in claim 5 wherein a start address counter is connected to said memory to count the number of times that the memory restarts its program before reaching the end location to conclude that there is no code present after a predetermined number ($m$) of restarts.

7. A code detector as defined in claim 6 wherein said start address counter gives an output after said predetermined number ($m$) of restarts, the output of said counter and said start address counter being transmitted to a logic unit which gives an output when ($n$) successive codes have been detected with less than ($m$) restarts.

8. A code detector as defined in claim 7 wherein the device recognises that the data is not a code but could be an inverted code and causes the subsequent incoming data to be converted.

* * * * *